(12) United States Patent
Tseng et al.

(10) Patent No.: US 9,853,215 B1
(45) Date of Patent: Dec. 26, 2017

(54) RESISTANCE SWITCHING MEMORY DEVICE AND METHOD OF MANUFACTURING THE SAME

(71) Applicant: MACRONIX INTERNATIONAL CO., LTD., Hsinchu (TW)

(72) Inventors: Po-Hao Tseng, Taichung (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/365,985

(22) Filed: Dec. 1, 2016

(51) Int. Cl.
H01L 45/00 (2006.01)

(52) U.S. Cl.
CPC .......... *H01L 45/1266* (2013.01); *H01L 45/08* (2013.01)

(58) Field of Classification Search
CPC .............................. H01L 45/08; H01L 21/1266
See application file for complete search history.

(56) References Cited

U.S. PATENT DOCUMENTS

| | | | |
|---|---|---|---|
| 7,473,576 B2 | 1/2009 | Lung | |
| 7,855,378 B2 | 12/2010 | Lin et al. | |
| 7,911,030 B2 | 3/2011 | Chung | |
| 8,598,011 B2 | 12/2013 | Song et al. | |
| 8,767,439 B2 | 7/2014 | Teria | |
| 9,431,603 B1 * | 8/2016 | Hsieh | H01L 45/085 |
| 9,502,466 B1 * | 11/2016 | Chuang | H01L 27/222 |
| 2008/0173931 A1 | 7/2008 | Ho et al. | |
| 2008/0308781 A1 | 12/2008 | Liao et al. | |
| 2011/0147694 A1 * | 6/2011 | Song | H01L 27/101 257/3 |
| 2011/0175051 A1 * | 7/2011 | Song | H01L 45/04 257/4 |
| 2016/0005960 A1 | 1/2016 | Suguro | |

FOREIGN PATENT DOCUMENTS

| | | |
|---|---|---|
| TW | 200828516 | 7/2008 |
| TW | 200845363 | 11/2008 |
| TW | 201006020 A | 2/2010 |
| TW | 201314982 A1 | 4/2013 |

OTHER PUBLICATIONS

Chien, et al.: "A Forming-free WOX Resistive Memory Using a Novel Self-aligned Field Enhancement Feature with Excellent Reliability and Scalability"; 978-1-4244-7419-6/10/$26.00 © 2010 IEEE; pp. 19.2.1-19.2.4.
TIPO Office Action dated Jun. 21, 2017 in Taiwan application (No. 105139112).

* cited by examiner

*Primary Examiner* — Dung Le
(74) *Attorney, Agent, or Firm* — McClure, Qualey & Rodack, LLP

(57) ABSTRACT

A resistance switching memory device is provided, including an insulating layer having a top surface, a bottom electrode embedded in the insulating layer, a resistance switching layer disposed on the bottom electrode, and a top electrode formed on the resistance switching layer and covering the resistance switching layer. Also, the bottom electrode has an upper portion protruding from the top surface of the insulating layer, and the upper portion has round corners at edges.

18 Claims, 5 Drawing Sheets

RESISTANCE SWITCHING MEMORY DEVICE AND METHOD OF MANUFACTURING THE SAME

BACKGROUND

Field of the Invention

The disclosure relates in general to a memory device and a method of manufacturing the same, more particularly to a resistance switching memory device with TiON free and a method of manufacturing the same.

Description of the Related Art

Resistive random-access memory (RRAM or ReRAM) device is a non-volatile type of memory device. Resistive memories attract much attention due to its simple MIM (Metal-Insulator-Metal) structure and promising scalability. Different forms of ReRAM have been disclosed, based on different dielectric materials, spanning from perovskites to transition metal oxides to chalcogenides.

Resistance switching memory device, as the example of the transition metal oxide memory, is a group of two-terminal bistable memory devices that stores the data by different resistance levels. For example, a typical ReRAM device includes a W bottom electrode, a $WSi_xO_y$ memory and a TiN top electrode. In the conventional process, $TiON_x$ would be formed adjacent to the resistance switching layer (i.e. the memory layer) and has considerable effect on the switching characteristics of the device. It is desirable to develop and realize a resistance switching memory device with excellent structural reliability and electrical properties such as great stability of data storage.

SUMMARY

The disclosure relates to a resistance switching memory device and a method of manufacturing the same, which develops a convex bottom electrode with TiON free and a smooth top surface of the bottom electrode, thereby improving the reliability and electrical performance of the resistance switching memory device.

According to an embodiment, a resistance switching memory device is provided, comprising an insulating layer having a top surface; a bottom electrode embedded in the insulating layer, and an upper portion of the bottom electrode protruding from the top surface of the insulating layer and the upper portion has round corners at edges; a resistance switching layer disposed on the bottom electrode; and a top electrode formed on the resistance switching layer and covering the resistance switching layer.

According to another embodiment, a resistance switching memory device is provided, comprising an insulating layer having a top surface; a convex bottom electrode embedded in the insulating layer and protruding from the top surface of the insulating layer; spacers surrounding lateral sidewalls of a protruding portion of the convex bottom trode; a resistance switching layer disposed on the convex bottom electrode; and a top electrode formed on the resistance switching layer, wherein the top electrode covers the resistance switching layer and the spacers.

According to an embodiment, a method of manufacturing a resistance switching memory device is disclosed, comprising providing an insulating layer having a hole; forming a bottom electrode for filling up the hole of the insulating layer, wherein an upper portion of the bottom electrode protrudes from the insulating layer, and the upper portion has round corners at edges; disposing a resistance switching layer on the bottom electrode; and forming a top electrode on the resistance switching layer and covering the resistance switching layer.

The disclosure will become apparent from the following detailed description of the preferred but non-limiting embodiments. The following description is made with reference to the accompanying drawings.

BRIEF DESCRIPTION OF THE DRAWINGS

FIG. 2A FIG. 2H-1(/FIG. 2H-2) illustrate a method of manufacturing a resistance switching memory device according to one embodiment of the present disclosure.

DETAILED DESCRIPTION

Figure 1:
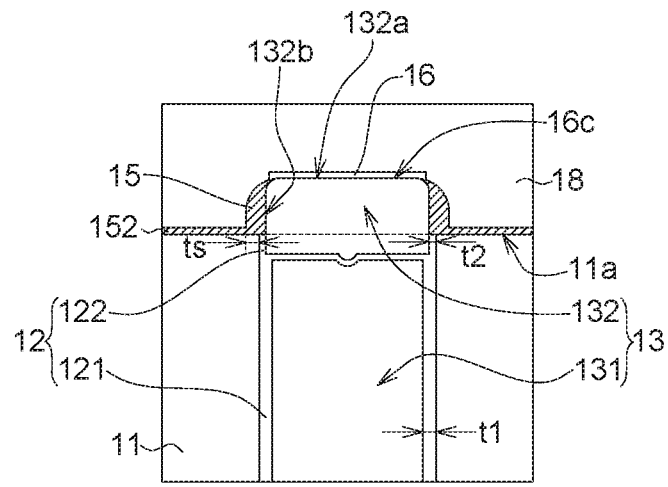
FIG. 1 simply depicts a resistance switching memory device according to one embodiment of the present disclosure.

In the embodiments of the present disclosure, a resistance switching memory device and method of manufacturing the same are provided. The resistance switching memory device of the embodiment develops a convex bottom electrode with TiON free, a smooth top surface of the bottom electrode and electrical field enhanced corner, thereby improving the reliability and electrical performance of the resistance switching memory device. Moreover, the method of the present embodiment not only significantly improves properties of the related elements (ex: a smooth top surface of the bottom electrode), but also is applicable for forming a self-aligned structure of a resistance switching layer.

Several embodiments are provided hereinafter with reference to the accompanying drawings for describing the related procedures and configurations. Related structural details, such as layers and spatial arrangement, are further described in the embodiments. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

FIG. 1 simply depicts a resistance switching memory device according to one embodiment of the present disclosure. A resistance switching memory device comprises an insulating layer 11 (such as an inter-layered dielectric (ILD)) having a hole 112, a bottom electrode 13, a resistance switching layer 16 formed on the bottom electrode 13, and a top electrode 18 formed on the resistance switching layer 16 and covering the resistance switching layer 16. According to the embodiment, the bottom electrode 13 embedded in the insulating layer 11, wherein an upper portion of the bottom electrode protrudes from the insulating layer 11 (i.e. the bottom electrode 13 has a concave profile). As shown in FIG. 1, the bottom electrode 13 can be regarded as a combination of a lower portion 131 embedded in the insulating layer 11 and an upper portion 132 protruding from the top surface 11a of the insulating layer 11 (i.e. the dashed line in FIG. 1 denotes the upper portion 132 protruding from the top surface 11a of the insulating layer 11). A top surface 132a of the upper portion 132 of the bottom electrode 13 has a substantial smooth surface and is higher than the top surface 11a of the insulating layer 11. The upper portion 132 of the bottom electrode 13 has round corners at edges. Also, according to the structure of the embodied device, the resistance switching layer 16 is positioned at a higher horizontal level than the insulating layer 11; therefore, the bottom surface 16c of the resistance switching layer 16 is higher than the top surface 11a of the insulating layer 11. Additionally, FIG. 1 depict only a single layer as the resistance switching layer 16 for simply illustrating one of possible embodied structures, not for the purpose of limitation. According to the embodiment, the resistance switching layer 16 can be a single layer or a bilayer structure, depending on the requirements of practical application and can be achieved by slightly varying the manufacturing method in the application. In one embodiment, the resistance switching layer 16 can be a self-aligned bilayer structure (which would be described in the illustration of FIG. 2A-FIG. 2H-1 later).

Also, the resistance switching memory device of the embodiment further comprises the spacers 15 formed on the insulating layer 11 and adjacent to the bottom electrode 13; for example, the spacers 15 are formed at (ex: surround) the lateral sidewalls 132b of the upper portion 132 of the bottom electrode 13, wherein the top electrode 18 covers the resistance switching layer 16 and the spacers 15. According to the embodiment, the lateral sidewalls 132b of the bottom electrode 13 are fully covered by the thick spacers 15, so that the spacers 15 electrically isolate the lateral sidewalls 132b of the bottom electrode 13 from the top electrode 18. Therefore, resistive switching can be dominated at the central part of the resistance switching layer 16 due to the spacers 15 covering the lateral sidewalls 132b of the bottom electrode 13. In one embodiment, the thickness is of the spacers 15 is, but not limitedly, in a range of 20 Å-50 Å. In one embodiment, the thickness of the resistance switching layer 16 is, but not limitedly, in a range of 15 Å-70 Å.

Also, resistance switching memory device of the embodiment further comprises a conductive barrier 12 for separating the insulating layer 11 and the lower portion 131 of the bottom electrode 13. It is known that direct deposition of the bottom electrode 13 (ex: tungsten) in the hole 112 without any barrier causes cracks or peels of the bottom electrode 13 in the subsequently manufacturing process. According to the embodiment, the spacers 15 shield the conductive barrier 12, and the concave bottom electrode 13 makes the resistance switching layer 16 apart from the conductive barrier 12, thereby efficiently preventing oxidation of the conductive barrier during formation of the resistance switching layer 16. In one embodiment, the conductive barrier 12 comprises a first barrier layer 121 having a first barrier thickness t1 (ex: 25 Å-75 Å), and a second barrier layer 122 formed above the first barrier layer 121 and having a second barrier thickness t2 (ex: 100 Å-200 Å), wherein the second barrier thickness t2 is different from (i.e. smaller than) the first barrier thickness t1. As shown in FIG. 1, the second barrier layer 122 is disposed between the upper portion 132 of the bottom electrode 13 and the insulating layer 11, and the second barrier layer 122 is positioned below the top surface 11a of the insulating layer 11.

FIG. 2A-FIG. 2H-1(/FIG. 2H-2) illustrate a method of manufacturing a resistance switching memory device according to one embodiment of the present disclosure. Tungsten (W) is exemplified as the material of the bottom electrode 13 in FIG. 2A-FIG. 2H-1 for clear illustration. But the disclosure is not limited to W.

Figure 2A:
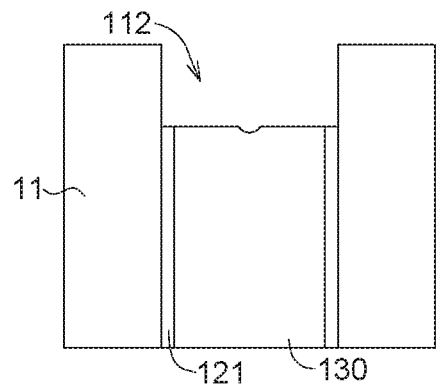

First, an insulating layer 11 (ex: ILD) having a hole filled with an etched back conductive plug 130 (ex: W-plug) is provided, as shown in FIG. 2A. Also, the first barrier layer 121 (ex: TiN) is formed between the etched back conductive plug 130 and the insulating layer 11. In one embodiment, the thickness (t1) of the first barrier layer 121 is in a range of 100 Å-200 Å.

Figure 2B:
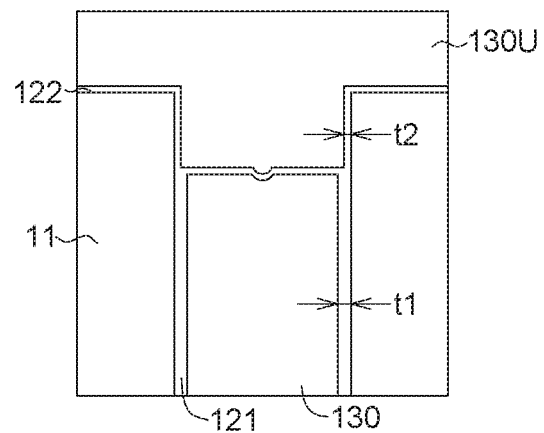
Figure 2C:
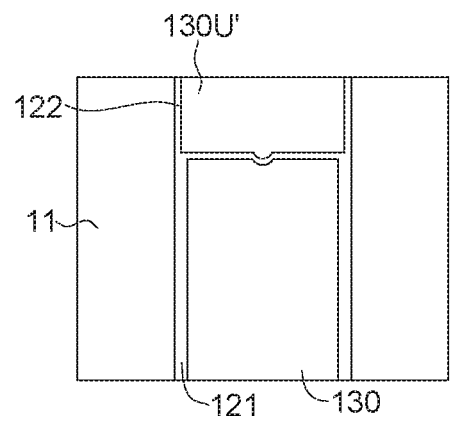

Then, deposition of the second barrier layer 122 (ex: TiN) is conducted, and a conductive layer 130U such as a W material layer is formed above the insulating layer 11, as shown in FIG. 2B. In one embodiment, the thickness of the second barrier layer 122 is in a range of 10 Å-100 Å, or 25 Å-75 Å, which is thinner than that of the first barrier layer 121. Then, a planarization step such as CMP is performed on the conductive layer 130U (ex: W material layer) until the portion of the second barrier layer 122 on the insulating layer 11 being completely removed (ex: stop at the ILD end point), as shown in FIG. 2C. Deposition of the barrier layers twice and formation of a patterned conductive layer (ex: a patterned W material layer) 130U' (formed from the conductive layer 130U) on the conductive plug 130 (ex: W-plug) create a seam-free W-plug (FIG. 2C).

Figure 2D:
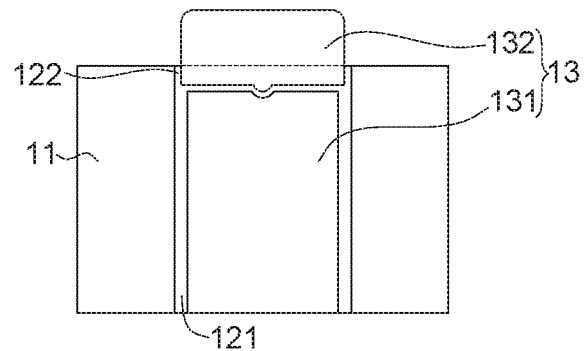

Next, formation of the concave bottom electrode 13 is conducted, by partially removing the insulating layer and the conductive barrier to expose the upper portion 132 of the bottom electrode 13, as shown in FIG. 2D. In one embodiment, the insulating layer 11 and the second barrier layer 122 of conductive barrier 12 can be partially removed by an oxide buffing (and polishing) process, so as to form a smooth top surface 132a of the bottom electrode 13. After the oxide buffing process (such as CMP or etching back), the smooth top surface 132a of the bottom electrode 13 is achieved since the silicon dioxide slurry performs a physical polishing to the bottom electrode 13 and performs a chemical polishing to the insulating layer 11 (ex: ILD). Also, the rounded corners at the edges of the bottom electrode 13 can be achieved after the oxide buffing process (such as CMP or etching back). The rounded corners of the bottom electrode improve the conformity of the electrical field during an operation of the resistance switching memory device in a later stage to achieve a better performance of the resistance switching memory device Additionally, material examples of the bottom electrode 13 include, but not limited to, W, Cu, Fe, Ti, Ni, Hf, TiN, TaN, and other applicable materials.

Additionally, protruding extent of the bottom electrode 13 (i.e. the thickness $T_{BY}$) can be varied by changing the second barrier thickness t2 of the second barrier layer 122. In some of experimental examples, if a W material layer and a TiN layer are formed respectively as the bottom electrode and the second barrier layer, the results have proved that protruding degree of the W material layer is correlated with the thickness of the TiN layer when the conditions of the oxide buffing process (ex: the oxide buffing time) are fixed. In one embodiment, a thickness ($T_{BY}$) of the upper portion 132 of the bottom electrode 13 is in a range of 50 Å-1000 Å, and can be in a range of 200 Å-1000 Å. For example, when the second barrier thickness t2 of the second barrier layer 122 are 75 Å, 45 Å and 25 Å, the thickness $T_{BY}$ are about 200 Å, 400 Å and 600 Å, respectively. The larger the second barrier thickness t2, the less protruding extent of the bottom electrode (under the same conditions of the oxide buffing process). Those numerical values listed above are provided for illustration, not for limitation. The numerical values of the second barrier thickness, the thickness ($T_{BY}$) of the upper portion 132 of the bottom electrode 13, the thickness of the resistance switching layer 16 and the thickness of the spacers can be varied and/or determined according to the requirements of the actual applications.

Figure 2E:
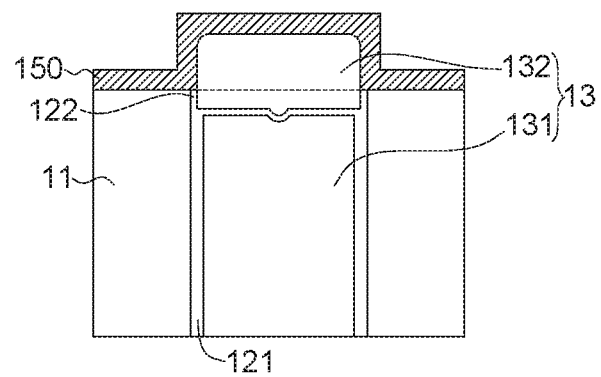
Figure 2F:
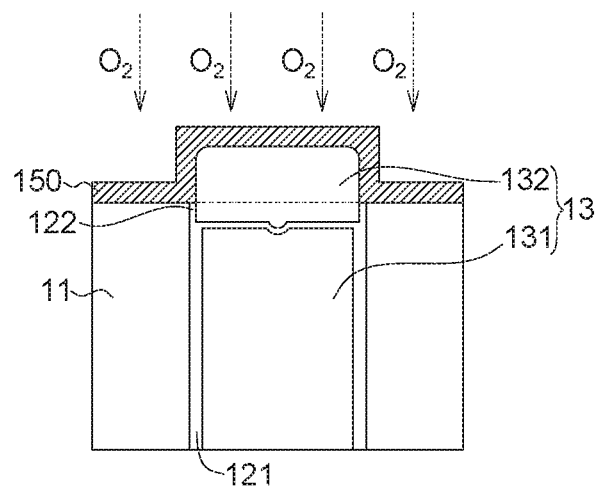
Figure 2G:
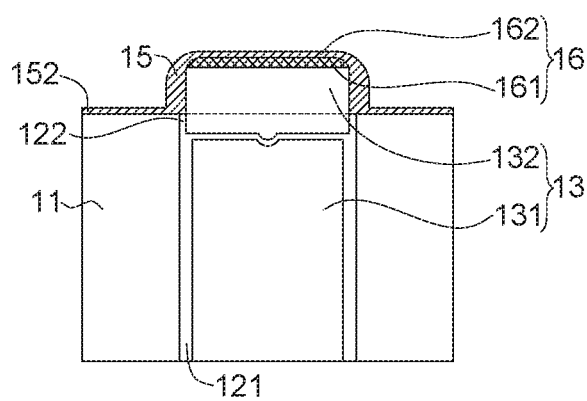

Afterwards, formation of the spacers 15 and the resistance switching layer 16 are performed. According to the embodied method, the spacers 15 and the resistance switching layer 16 can be formed in separated steps or simultaneously formed in one step. FIG. 2E-FIG. 2G illustrate one method for simultaneously forming the spacers 15 and the resistance switching layer 16.

As shown in FIG. 2E, a dielectric layer 150 such as an oxide layer can be deposited on the insulating layer 11 and the bottom electrode 13. It is noted that the oxide layer provided herein is only for illustration, and material examples of a dielectric layer 150 (ex: 20 Å-50 Å) for forming spacers 15 include oxides, nitrides or other suitable dielectric materials, and not limited to oxides.

Figures 1, 2H:
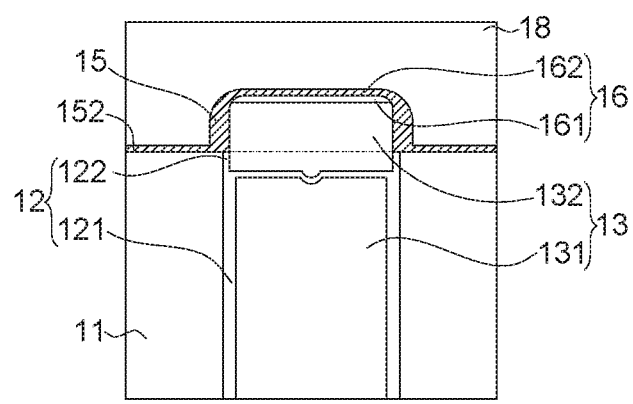

Afterward, an oxygen plasma etching step is performed anisotropically, as shown in FIG. 2F. During the plasma etching step, the oxide layer (i.e. the dielectric layer 150) is thinned down to form the spacers 15 surrounding the lateral sidewalls 132b (of the upper portion 132) of the bottom electrode 13. For example, a CVD oxide (i.e. the dielectric layer 150 in FIG. 2E, such as $SiO_2$) would be re-sputtered during oxygen plasma etching, and therefore thin down the thickness at the central part of the dielectric layer 150 (such as $SiO_2$). After oxygen plasma etching step, the spacers 15 and the resistance switching layer 16 can be formed simultaneously, as shown in FIG. 2G. Then, the top electrode 18 is formed on the resistance switching layer 16 and covers the resistance switching layer 16, as shown in FIG. 2H-1. After top electrode deposition and definition, a CMOS back-end process may be performed. Also, an oxide thin film 152 could be optionally remained on the top surface 11a of the insulating layer 11. However, the present disclosure is not limited thereto; in some embodiments, no oxide thin film is remained on the top surface 11a of the insulating layer 11 after the oxygen plasma etching step.

Moreover, the resistance switching layer 16 as shown in FIG. 2G could be a single layer or a bilayer structure, depending on the conditions of the oxygen plasma etching process. For example, if the energy/power level of plasma condition for performing oxygen plasma etching is high enough for conducting $O_2$ penetration to the upper portion 132 of the bottom electrode 13 so that a metal oxide layer 161 can be formed by consuming the material of the bottom electrode during oxygen plasma etching (ex: consuming W to form a $WO_3$ layer). Simultaneously, the spacers 15 are formed for surrounding the lateral sidewalls of the bottom electrode 13 by thinning down the oxide layer (i.e. the dielectric layer 150) during oxygen plasma etching, and the dielectric layer 162 (ex: having the same material as the spacers 15, such as silicon oxide) is formed on the metal oxide layer 161, as shown in FIG. 2H-1. Accordingly, a self-aligned bilayer structure including the dielectric layer 162 (ex: $SiO_2$) and the metal oxide layer 161 (ex: $WO_3$) is formed. In one example, a self-aligned bilayer structure including a $WO_3$ layer (i.e. the metal oxide layer 161) having a thickness of 5 Å-30 Å and a $SiO_2$ layer (i.e. the dielectric layer 162) having a thickness of 10 Å-40 Å can be formed. In this illustrative example, the metal oxide layer 161 and the dielectric layer 162 function as a resistance switching layer 16 of an embodied resistance switching memory device.

Figures 2, 2H:
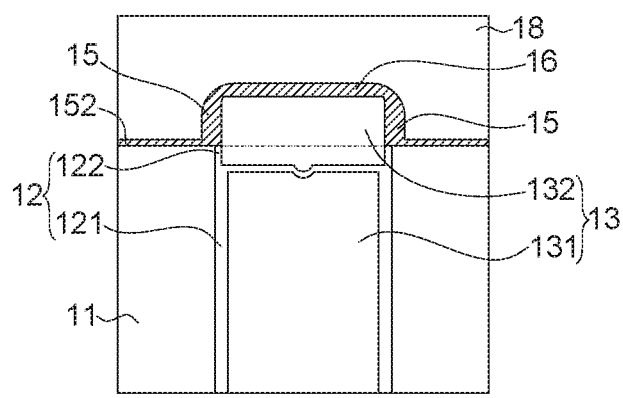

Alternatively, the energy/power level of plasma condition for performing the oxygen plasma etching would be too low to conduct oxygen penetration to the bottom electrode; accordingly, only a single layer such as an oxide layer (ex: having the same material as the spacers 15, such as silicon oxide) is formed on the bottom electrode 13 as a resistance switching layer 16 after the oxygen plasma etching is completed, as shown in FIG. 2H-2.

Also, the oxygen plasma etching conditions are (but not limited to): 60B-100B of bias (along the direction vertical to the top surface 11a of the insulating layer 11), 30 mt-60 mt of pressure, 300 W-600 W of power, and 30 s-100 s of etching time. Additionally, material examples of the resistance switching layer 16 (single layer) or spacers 15 include, but not limited to, $SiO_2$, $HfO_2$, TiOx, TiON, WOx, $Ta_2O_5$, $Al_2O_3$, and other applicable materials. Material examples of the self-aligned multi-layer RRAM film (i.e. the metal oxide layer 161 and the dielectric layer 162; the resistance switching layer 16) include, but not limited to, $SiO_2$/WOx, $SiO_2$/$HfO_2$, $HfO_2$/WOx, TiOx/WOx, TiON/WOx, $Al_2O_3$/WOx and other applicable materials. It is noted that those material examples listed above are provided for illustration, not for limitation.

Figure 3A:
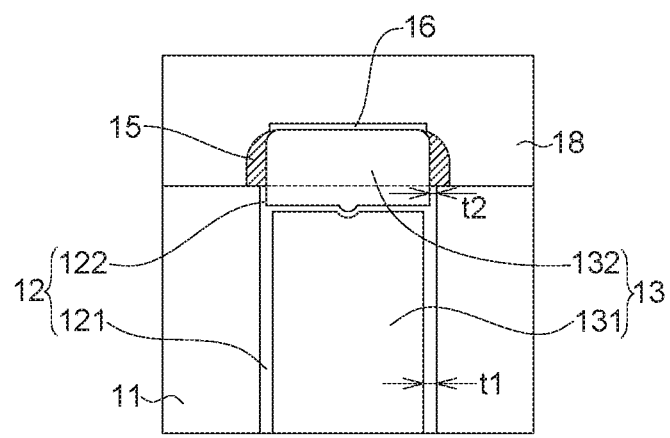
FIG. 3A simply depicts a resistance switching memory device according to another embodiment of the present disclosure.
Figure 3B:
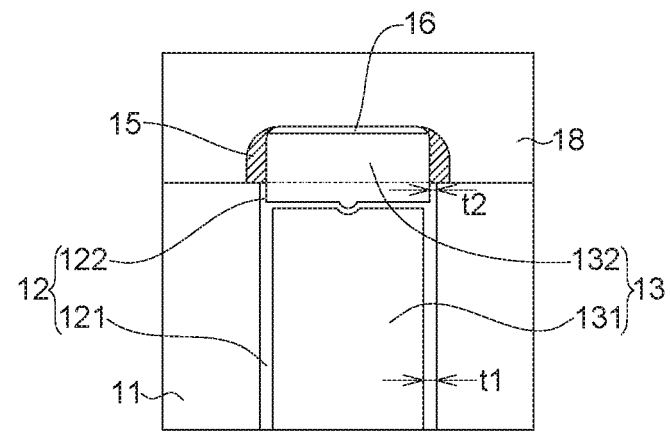
FIG. 3B simply depicts a resistance switching memory device according to a further embodiment of the present disclosure.

Although FIG. 2E-FIG. 2G illustrate one method for simultaneously forming the spacers 15 and the resistance switching layer 16, the spacers 15 and the resistance switching layer 16 can be formed in separated steps. FIG. 3A and FIG. 3B show two of possible structures of the embodied resistance switching memory devices in the applications.

FIG. 3A simply depicts a resistance switching memory device according to another embodiment of the present disclosure. FIG. 3B simply depicts a resistance switching memory device according to a further embodiment of the present disclosure. Please also refer to FIG. 1. Also, the identical and/or similar elements in the structures of FIG. 3A/FIG. 3B and FIG. 1 are designated with the same and/or similar reference numerals, and the details of the configurations, procedures and working principles of the identical components/layers are not redundantly described.

In FIG. 3A and FIG. 3B, the material of the spacers 15 can be nitride or other material (ex: formed by depositing a nitride layer as the dielectric layer 150 in FIG. 2E, followed by etching to form the nitride spacers 15). The resistance switching layer 16 is then formed on the bottom electrode 13, as shown in FIG. 3A. If an oxidation process is performed to form the resistance switching layer 16, part of the bottom electrode 13 is consumed to form the resistance switching layer 16, as shown in FIG. 3B.

Figure 4:
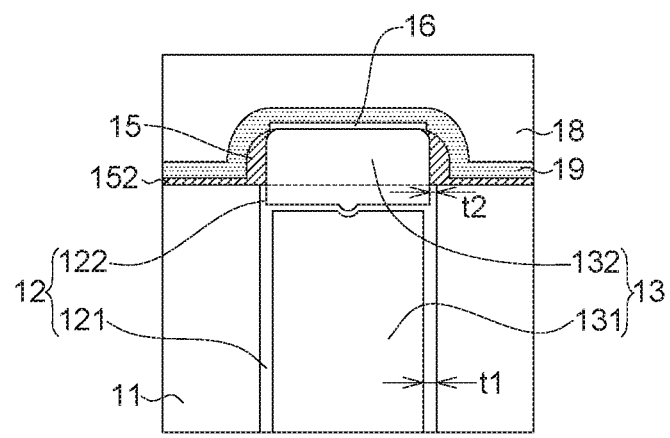
FIG. 4 simply depicts a resistance switching memory device according to yet another embodiment of the present disclosure.

FIG. 4 simply depicts a resistance switching memory device according to yet another embodiment of the present disclosure. Please also refer to FIG. 1. Structures of FIG. 4 and FIG. 1 are identical, except for formation of an oxygen ion reservoir layer 19. Also, the identical and/or similar elements in the structures of FIG. 4 and FIG. 1 are designated with the same and/or similar reference numerals, and the details of the configurations, procedures and working principles of the identical components/layers are not redundantly described. As shown in FIG. 4, an oxygen ion reservoir layer 19 can be optionally deposited between the top electrode 18 and the resistance switching layer 16 (ex: on a self-aligned SiO$_2$/WO$_3$ RRAM film) for providing oxygen to enhance switching performance of the device. Also, the oxygen ion reservoir layer 19 covers the spacers 15 and the resistance switching layer 16. In one embodiment, the thickness of the oxygen ion reservoir layer 19 is in a range of 10 Å to 100 Å. Material examples of the oxygen ion reservoir layer 19 include, but not limited to, TiOx, TiON, HfO2, Al$_2$O$_3$, Ta$_2$O$_5$, and other applicable materials.

According to the aforementioned description, the spacers 15 shield the conductive barrier 12 during formation of the resistance switching layer 16. Accordingly, no oxidation of the conductive barrier 12 (ex: TiN) occurs during formation of the resistance switching layer 16. Thus, a resistance switching memory device with TiON-free sidewalls can be achieved according to the structure and method provided in the embodiments. Also, a smooth top surface and the electrical field enhanced corner of the bottom electrode can be achieved according to the structure and method provided in the embodiments. Also, the method of the present embodiment is applicable for forming a self-aligned structure of a resistance switching layer. Accordingly, the reliability and electrical performance of the resistance switching memory device can be improved by applying the embodied structures and methods.

Other embodiments with different configurations of known elements in the device can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A resistance switching memory device, comprising:
   an insulating layer having a top surface;
   a bottom electrode disposed in the insulating layer, wherein an upper portion of the bottom electrode protrudes from the top surface of the insulating layer and the upper portion has round corners at edges, and a lower portion of the bottom electrode is embedded in the insulating layer;
   a barrier layer, embedded in the insulating layer for separating the insulating layer and the bottom electrode, and the barrier layer comprising a first barrier layer having a first barrier thickness, and a second barrier layer formed above the first barrier layer and having a second barrier thickness, wherein the second barrier thickness is smaller than the first barrier thickness;
   a resistance switching layer disposed on the bottom electrode; and
   a top electrode, formed on the resistance switching layer and covering the resistance switching layer.

2. The resistance switching memory device according to claim 1, wherein a top surface of the upper portion of the bottom electrode is higher than the top surface of the insulating layer.

3. The resistance switching memory device according to claim 1, wherein the barrier layer is disposed between the upper portion of the bottom electrode and the insulating layer, and the barrier layer positioned below the top surface of the insulating layer.

4. The resistance switching memory device according to claim 1, further comprising spacers formed on the insulating layer and at lateral sidewalls of the upper portion of the bottom electrode.

5. The resistance switching memory device according to claim 4, wherein the spacers surround the lateral sidewalls of the upper portion of the bottom electrode, and the lateral sidewalls of the bottom electrode and the top electrode are electrically isolated by the spacers.

6. The resistance switching memory device according to claim 1, wherein the resistance switching layer is a single layer.

7. The resistance switching memory device according to claim 1, wherein the resistance switching layer is a bilayer structure.

8. The resistance switching memory device according to claim 1, wherein the resistance switching layer comprises:
   a metal oxide layer, formed on the bottom electrode; and
   a dielectric layer, formed on the metal oxide layer.

9. The resistance switching memory device according to claim 1, wherein the barrier layer is a conductive barrier for separating the insulating layer and the lower portion and the upper portion of the bottom electrode.

10. The resistance switching memory device according to claim 9, further comprising spacers formed at lateral sidewalls of the upper portion of the bottom electrode, wherein the spacers shield the conductive barrier.

11. The resistance switching memory device according to claim 1, wherein a thickness of the upper portion of the bottom electrode is in a range of 50 Å-1000 Å.

12. The resistance switching memory device according to claim 1, further comprising an oxygen ion reservoir layer between the top electrode and the resistance switching layer.

13. A resistance switching memory device, comprising:
    an insulating layer having a top surface;
    a convex bottom electrode, embedded in the insulating layer and protruding from the top surface of the insulating layer;
    spacers, surrounding lateral sidewalls of an upper portion of the convex bottom electrode;
    a barrier layer, embedded in the insulating layer for separating the insulating layer and the convex bottom electrode, and the barrier layer comprising a first barrier layer having a first barrier thickness, and a second barrier layer formed above the first barrier layer and having a second barrier thickness, wherein the second barrier thickness is smaller than the first barrier thickness;
    a resistance switching layer, disposed on the convex bottom electrode; and
    a top electrode, formed on the resistance switching layer and covering the resistance switching layer and the spacers.

14. The resistance switching memory device according to claim 13, wherein the barrier layer is disposed between the upper portion of the convex bottom electrode and the insulating layer, and the barrier layer is positioned below the top surface of the insulating layer.

15. A method of manufacturing a resistance switching memory device, comprising:
- providing an insulating layer having a hole;
- forming a bottom electrode for filling up the hole of the insulating layer, wherein an upper portion of the bottom electrode protrudes from the insulating layer, and the upper portion has round corners at edges;
- disposing a resistance switching layer on the bottom electrode, comprising:
  - forming an oxide layer on the insulating layer and the bottom electrode; and subjecting the oxide layer to an oxygen plasma etching process anisotropically, wherein spacers are formed for surrounding lateral sidewalls of the upper portion of the bottom electrode, and the resistance switching layer with a self-aligned structure is generated simultaneously after the oxygen plasma etching process; and
- forming a top electrode on the resistance switching layer and covering the resistance switching layer.

16. The method according to claim 15, wherein said forming the bottom electrode comprising:
- providing a structure having the bottom electrode filling up the hole and a conductive barrier in the hole for separating the insulating layer and the bottom electrode; and
- partially removing the insulating layer and the conductive barrier to expose the upper portion of the bottom electrode.

17. The method according to claim 16, wherein the insulating layer and the conductive barrier are partially removed by an oxide buffing process to form a smooth top surface of the bottom electrode.

18. The method according to claim 16, wherein the conductive barrier comprises:
- a first barrier layer, having a first barrier thickness; and
- a second barrier layer, formed above the first barrier layer and having a second barrier thickness,
- wherein the second barrier thickness is smaller than the first barrier thickness.

\* \* \* \* \*